(12) United States Patent
Ueta

(10) Patent No.: US 12,207,486 B2
(45) Date of Patent: Jan. 21, 2025

(54) LIGHT-EMITTING ELEMENT FOR RESTRAINING DEGRADATION OF ELECTRICAL AND OPTICAL PROPERTIES

(71) Applicant: SHARP KABUSHIKI KAISHA, Sakai (JP)

(72) Inventor: Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 59 days.

(21) Appl. No.: 17/769,565

(22) PCT Filed: Oct. 30, 2019

(86) PCT No.: PCT/JP2019/042664
§ 371 (c)(1),
(2) Date: Apr. 15, 2022

(87) PCT Pub. No.: WO2021/084660
PCT Pub. Date: May 6, 2021

(65) Prior Publication Data
US 2024/0090251 A1    Mar. 14, 2024

(51) Int. Cl.
*H10K 50/115*      (2023.01)
*H10K 50/15*       (2023.01)
*H10K 50/16*       (2023.01)
*H10K 102/00*      (2023.01)

(52) U.S. Cl.
CPC ......... *H10K 50/115* (2023.02); *H10K 50/156* (2023.02); *H10K 50/166* (2023.02); *H10K 2102/351* (2023.02)

(58) Field of Classification Search
CPC .. H10K 50/115; H10K 50/166; H10K 50/156; H10K 2102/351
USPC .......................................................... 257/40
See application file for complete search history.

(56) References Cited

U.S. PATENT DOCUMENTS

| | | |
|---|---|---|
| 2008/0143906 A1 | 6/2008 | Allemand et al. |
| 2008/0259262 A1 | 10/2008 | Jones et al. |
| 2009/0321113 A1 | 12/2009 | Allemand et al. |
| 2009/0321364 A1 | 12/2009 | Spaid et al. |
| 2010/0243295 A1 | 9/2010 | Allemand et al. |
| 2011/0088770 A1 | 4/2011 | Allemand et al. |
| 2011/0297642 A1 | 12/2011 | Allemand et al. |
| 2012/0033367 A1 | 2/2012 | Jones et al. |
| 2014/0338735 A1 | 11/2014 | Allemand et al. |
| 2015/0287927 A1* | 10/2015 | Okubo ................. H10K 85/141 257/40 |
| 2017/0362504 A1 | 12/2017 | Hirst et al. |
| 2018/0294432 A1 | 10/2018 | Yamaguchi et al. |

(Continued)

FOREIGN PATENT DOCUMENTS

| | | |
|---|---|---|
| JP | 2010507199 A | 3/2010 |
| JP | 2018502950 A | 2/2018 |

(Continued)

*Primary Examiner* — Jami Valentine Miller
(74) *Attorney, Agent, or Firm* — ScienBiziP, P.C.

(57) ABSTRACT

A light-emitting element includes: a first electrode; a second electrode; a light-emitting layer between the first electrode and the second electrode; and a sulfur-atom-fixing material between the first electrode and the second electrode, the sulfur-atom-fixing material being configured to fix sulfur atoms by chemically binding to the sulfur atoms.

8 Claims, 5 Drawing Sheets

(56) References Cited

U.S. PATENT DOCUMENTS

| | | |
|---|---|---|
| 2019/0191569 A1 | 6/2019 | Jones et al. |
| 2021/0028321 A1 | 1/2021 | Allemand et al. |
| 2024/0090251 A1* | 3/2024 | Ueta .................. H05B 33/28 |

FOREIGN PATENT DOCUMENTS

| | | |
|---|---|---|
| JP | 2018181493 A | 11/2018 |
| WO | 2014/057968 A1 | 4/2014 |
| WO | 2014/129381 A1 | 8/2014 |

* cited by examiner

LIGHT-EMITTING ELEMENT FOR RESTRAINING DEGRADATION OF ELECTRICAL AND OPTICAL PROPERTIES

TECHNICAL FIELD

The disclosure relates to light-emitting elements.

BACKGROUND ART

Patent Literature 1 discloses an OLED (organic light-emitting diode) structure for stabilizing the film quality of a transparent, silver-containing electrode. Specifically, a transparent, silver-containing electrode is provided on a base layer of an alkali or alkali earth metal to stabilize the film quality. This metal base layer contains one or more of barium, calcium, and magnesium.

CITATION LIST

Patent Literature

Patent Literature 1: Japanese Unexamined Patent Application Publication, Tokukai, No. 2018-181493

SUMMARY

Technical Problem

Sulfur atoms may contaminate a light-emitting layer and/or the vicinity thereof in the manufacture of light-emitting elements. Meanwhile, the QLED (quantum-dot light-emitting diode) light-emitting element may contain sulfur atoms in the core and/or shell in the light-emitting layer thereof. These sulfur atoms, upon reacting with a metal material in the transparent electrode, sulfurize the metal material. The sulfurization of the metal material in turn degrades the electrical properties of the light-emitting element, blackens the transparent electrode, thereby lowering the transparency of the light-emitting element, and causes other problems.

The disclosure has been made to address these problems and has an object to provide a light-emitting element in which the degradation of the electrical and optical properties is restrained.

Solution to Problem

To address these problems, the disclosure, in one aspect thereof, is directed to a light-emitting element including: a first electrode; a second electrode; a light-emitting layer between the first electrode and the second electrode; and a sulfur-atom-fixing material between the first electrode and the second electrode, the sulfur-atom-fixing material being configured to fix sulfur atoms by chemically binding to the sulfur atoms.

Advantageous Effects of Disclosure

The disclosure, in one aspect thereof, can restrain the degradation of electrical and optical properties.

Figure 1:
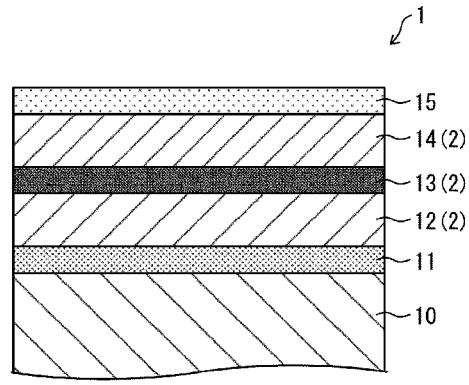
FIG. 1 is a schematic cross-sectional view of a light-emitting element in accordance with Example 1 of the disclosure.

Throughout the present specification, the Roman numerals denoting groups of elements follow the defunct CAS numbering system, and the Arabic numerals denoting groups of elements follow the current IUPAC numbering system.

Throughout the following description, expressions like "component A underlies/is below component B" indicate that component A is formed in an earlier process or step than component B, and expressions like "component A overlies/is on/is above component B" indicate that component A is formed in a later process or step than component B.

Example 1

As described above, known compositions lacking a S-(sulfur atom-) capturing material (fixing material) have a problem of a metal material such as Ag being sulfurized in the transparent electrode. The present disclosure can restrain this known problem by using a sulfur-atom-fixing material, thereby improving the reliability of the light-emitting element.

More specifically, the QLED and OLED contain either one of the metals of Ag, Al, and Mg or an alloy of these metals in the reflective electrode. The metals impart a high reflectance to the reflective electrode. The QLED and OLED further contain the same material in the form of a thin film in the transparent electrode as in the reflective electrode.

These silver-containing electrodes are known to be likely to turn black, which increases the electrical resistance of the electrode and decreases the reflectance and transmittance of the electrode. The blackened electrode might also peel off the structure. The blackening of the silver-containing electrode may hence lower the electrical properties, light emission characteristics, and long-term reliability of the light-emitting element.

In other words, the sulfur atoms in the QD (light-emitting layer) diffuse to the outside due to a concentration difference between the light-emitting layer and the outside, and upon reaching the electrode, turn the electrode black. This blackening reduces both the reflectance and transmittance of the light-emitting element and lowers the device properties and reliability, including the light extraction properties, of the light-emitting element.

The OLED and QLED may contain sulfur atoms in some particular layers in the element structure thereof, which can be a cause of the blackening. Especially, the QLED contains a large amount of elemental sulfur in the shells of quantum dots in the light-emitting layer.

Atmospheric air also contains sulfur. Silver exhibits such high chemical activity with sulfur that the presence of sulfur atoms around a silver-containing layer readily causes the reaction, $2Ag+S \rightarrow Ag_2S$, thereby promoting blackening.

Airborne sulfur atoms can be blocked primarily by the sealant of the light-emitting element. No techniques have been developed however that can prevent sulfurization by the sulfur atoms contained in the light-emitting element itself.

Accordingly, a compound that has a sulfur-atom-capturing (fixing) function is added to the sulfur-containing layer, especially to the light-emitting layer of the QLED and OLED.

The sulfur-atom-fixing material can confine sulfur atoms in the layer to which the sulfur-atom-fixing material is added because the sulfur-atom-fixing material selectively captures free sulfur atoms. The free sulfur atoms, hence stabilized by the sulfur-atom-fixing material, are stopped from reaching the silver-containing electrode. This mechanism can efficiently restrain the blackening of the silver in the electrode. The restrained blackening can improve the electrical properties, light emission characteristics, and long-term reliability of the light-emitting element.

The sulfur-atom-fixing material may be mixed with a QD colloid or an OLED light-emitting material.

Light-Emitting Element

FIG. 1 is a schematic cross-sectional view of a light-emitting element 1 in accordance with the present example of the disclosure.

The light-emitting element 1 includes a first electrode 11, a second electrode 15, a light-emitting layer 13, and a sulfur-atom-fixing material 2. The light-emitting layer 13 is disposed between the first electrode 11 and the second electrode 15. The sulfur-atom-fixing material 2 is disposed between the first electrode 11 and the second electrode 15 to fix sulfur atoms by chemically binding to the sulfur atoms. The following will describe a specific structure of the light-emitting element 1 with reference to FIG. 1.

The light-emitting element 1 is disposed on an array substrate 10 and is electrically connected to TFTs (thin film transistors) on the array substrate 10. The array substrate 10 may therefore be referred to as a TFT substrate.

The light-emitting element 1 includes the first electrode 11, a first carrier transport layer 12, the light-emitting layer 13, a second carrier transport layer 14, and the second electrode 15, all of which are stacked in this order from the bottom to the top in FIG. 1.

The first electrode 11 and the second electrode 15 contain a conductive material and are electrically connected respectively to the first carrier transport layer 12 and the second carrier transport layer 14. The first electrode 11 may be, for example, a light-reflecting, reflective electrode. The second electrode 15 may be, for example, a light-transmitting, transmissive electrode. The first electrode 11 and the second electrode 15 contain at least one of high-reflectance metals Ag, Al, and Mg.

The first carrier transport layer 12 is either one of an electron transport layer and a hole transport layer, whereas the second carrier transport layer 14 is the other one.

Specifically, if the first electrode 11 is an anode, and the second electrode 15 is a cathode, the first carrier transport layer 12 is a hole transport layer for transporting holes from the first electrode 11 to the light-emitting layer 13, whereas the second carrier transport layer 14 is an electron transport layer for transporting electrons from the second electrode 15 to the light-emitting layer 13.

On the other hand, if the first electrode 11 is a cathode, and the second electrode 15 is an anode, the first carrier transport layer 12 is an electron transport layer for transporting electrons from the first electrode 11 to the light-emitting layer 13, whereas the second carrier transport layer 14 is a hole transport layer for transporting holes from the second electrode 15 to the light-emitting layer 13.

The hole transport layer is, for example, an inorganic semiconductor layer. The electron transport layer may have a function of inhibiting hole transport.

The light-emitting layer 13 contains a quantum-dot (hereinafter, alternatively referred to as "QD") light-emitting material as a light-emitting body. Alternatively, the light-emitting layer 13 may contain an organic light-emitting material as a light-emitting body. In other words, the light-emitting element 1 may be a QLED light-emitting element or an OLED light-emitting element. The present example is described based on the light-emitting layer 13 containing quantum dots as a light-emitting body (the light-emitting element 1 being a QLED light-emitting element), with supplementary descriptions being given to an example where the light-emitting layer 13 contains an organic light-emitting material as a light-emitting body (the light-emitting element 1 is an OLED light-emitting element).

The quantum dot may have a so-called core/shell structure including a core and a shell surrounding the core (not shown). As an example, the light-emitting layer 13 may have a core of a II-VI compound, a III-V compound, or a III-V nitride and a shell of a II-VI compound covering the core. ZnS, which has a large band gap among II-VI compounds, is used as a shell material to confine carriers in the core. The light-emitting layer 13 may contain a sulfur-containing organic compound when the light-emitting layer 13 contains an organic light-emitting material.

Each layer in the light-emitting element 1 may be formed by sputtering a material doped with a desirable impurity or by coating with a colloidal solution of nanoparticles of a desirable material.

Each layer in the light-emitting element 1 may alternatively formed by using a technique selected as appropriate from, for example, coating and baking, photolithography, vapor deposition using a metal mask, resin injection, ashing, and dry/wet etching. No other special manufacturing techniques or equipment are required.

The array substrate 10, the first electrode 11, the second electrode 15, the first carrier transport layer 12, and the second carrier transport layer 14 may be made of materials typically used in the QLED light-emitting element and the OLED light-emitting element.

The sulfur-atom-fixing material 2 is provided in either the light-emitting layer 13 or the first carrier transport layer 12 and the second carrier transport layer 14, or in both.

A detailed description is given next of the light-emitting layer in the QLED. The Group VI element in a Group II-VI compound will generally readily dissociate. Sulfur atoms in the shell therefore dissociate in, for example, electron collisions and heating under voltage.

These sulfur atoms diffuse out of the light-emitting layer due to the concentration difference of sulfur atoms between the light-emitting layer and the surrounding layers. Since all the layers in the QLED are so thin as on the order of 10 nm, the sulfur atoms readily diffuse all the way through the layers to reach the electrode.

In the QLED, the reflective electrode (the first electrode 11 in FIG. 1) contains silver for the purpose of increasing the reflectance thereof, and the transmissive electrode (the second electrode 15 in FIG. 1), located on the opposite, light-extracting surface, also contains silver.

Weight Ratio of Sulfur-Atom-Fixing Material in Light-Emitting Layer

The sulfur-atom-fixing material 2, in the present example, preferably accounts for greater than or equal to 0.02% and less than or equal to 1% of the light-emitting layer 13 by weight.

In other words, in accordance with this weight ratio, the sulfur-atom-fixing material 2 in a QD solution that will form the light-emitting layer 13 has a weight ratio of greater than or equal to 0.1% and less than or equal to 5%. A material is analyzed for its weight ratio by, for example, GCMS (gas chromatography mass spectrometry).

GCMS is characterized as follows.
Substances Analyzable by GCMS
  Gaseous or gasifiable compounds
  Compounds gasifiable (without decomposing) at approximately 300° C. or lower temperature
  General organic compounds
  Organic metals (e.g., $CH_3HgCl$) are also analyzable
  Compounds with molecular weight up to approximately 1,000
Substances Analyzable by LCMS (Liquid Chromatography Mass Spectrometry)
  Compounds with large molecular weight, high boiling point, hardly gasifiable
  Hardly adsorbable compounds with zero to intermediate level of polarity
Required Amount of Samples (Mass Spectrometry Unit is Operative on Smaller Sample Amounts than GC)
  Approximately 1 µL for gas
  The element may be pulverized, gasified by heating, and mixed with, for example, gaseous He, to prepare an approximately at least 1-µL analyte for analysis.
Precision of Analysis (Quantitative Capability)
  Approximately 10 ppt The aforementioned minimum value "0.02%" is the concentration at which no electrode blackening or peel-off occurs before time t3 that is a measure for the practical reliability of, for example, a panel including the light-emitting element 1 (see FIG. 2, which will be described later in detail). The minimum value for the sulfur-atom-fixing material is determined by calculating an LT95-equivalent reliability (luminance decreases by 5%) from a decay factor for the degradation of properties, such as luminance decreases and voltage increases, caused by the blackening, peel-off, or increased resistance of a silver-containing electrode in an accelerated test conducted on the panel under the initial luminance condition of 20,000 $cd/m^2$ in a high-temperature, high-humidity environment (environmental temperature: 80° C., environmental humidity: 80%). The decay factor is the coefficient of time in an exponential function, including a power with a negative coefficient with respect to time, that represents the decaying of the light-emitting element.

The aforementioned maximum value "1°" is determined by comprehensively considering, for example, the viscosity, coating properties, and aggregation or lack of aggregation of a quantum-dot-containing solution. Adding a sulfur-atom-fixing material in excess of this maximum value is generally a cause of trouble in the formation of a QD layer. Adding a sulfur-atom-fixing material to the maximum value did not cause any trouble in the reliability test (accelerated test) detailed above.

Sufficient effects can be achieved from the addition of the sulfur-atom-fixing material 2 to the light-emitting layer 13 by setting the ratio to greater than or equal to 0.02%, and negative effects on the formation of the light-emitting layer 13 can be restrained by setting the ratio to less than or equal to 1%.

Brief Description of Accelerated Test

Figure 2:
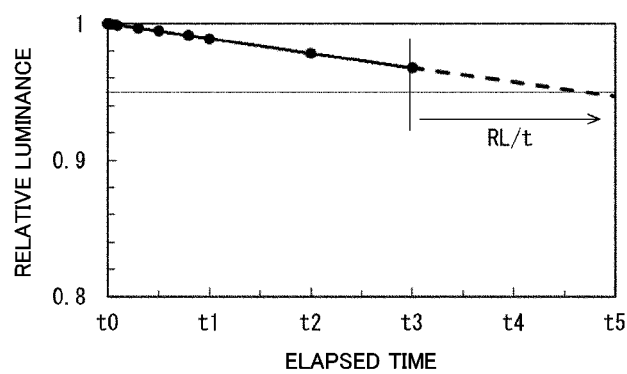
FIG. 2 is a representation of the results of a (first) accelerated test conducted on the light-emitting element shown in FIG. 1 in a high-temperature, high-humidity, high-luminance environment.

FIG. 2 is a representation of the results of an accelerated test (reliability test) conducted on the light-emitting element 1 in a high-temperature, high-humidity, high-luminance environment in accordance with the present example of the disclosure (first accelerated test, luminance changes). As described earlier, the accelerated test was conducted under the conditions of an environmental temperature of 80° C., an environment humidity of 80%, and an initial luminance of 20,000 $cd/m^2$.

FIG. 2 gives a relative luminance on the vertical axis and the time elapsed from the start of the test on the horizontal axis, with prescribed times t0, t1, t2, t3, t4, and t5 being plotted thereon as an example. Prescribed times t0, t1, t2, t3, t4, and t5, although denoting a shorter period of time in the order of t0, t1, t2, t3, t4, and t5, have specific numerical values respectively that may vary with the properties of the light-emitting element 1.

FIG. 2 shows that the relative luminance of the light-emitting element 1 decreased with a constant slope, but stayed above 0.95, from the start of the test to prescribed time t3. FIG. 2 further shows that the relative luminance RL (relative luminance) decreased with time t at substantially the same rate (RL/t) after time t3 as up to time t3.

Figure 3:
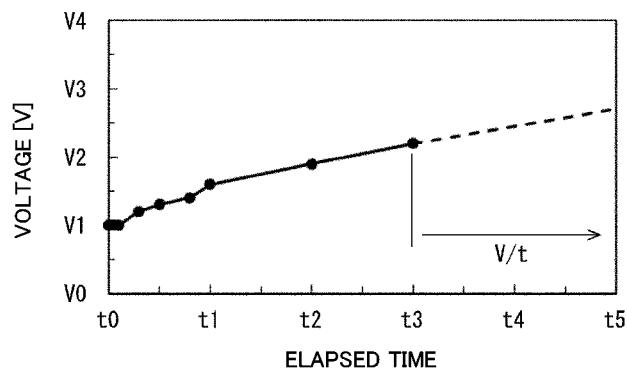
FIG. 3 is a representation of the results of another (second) accelerated test conducted on the light-emitting element shown in FIG. 1 in a high-temperature, high-humidity, high-luminance environment.

FIG. 3 is a representation of the results of an accelerated test conducted on the light-emitting element 1 in a high-temperature, high-humidity, high-luminance environment similar to FIG. 2 (second accelerated test, voltage changes). FIG. 3 shows that the voltage across the light-emitting element 1 increased to V2 over the period from the start of the test to prescribed time t3.

FIG. 3 further shows that the voltage V (voltage) increased with time t at substantially the same rate (V/t) after time t3 as up to time t3.

Figure 4:
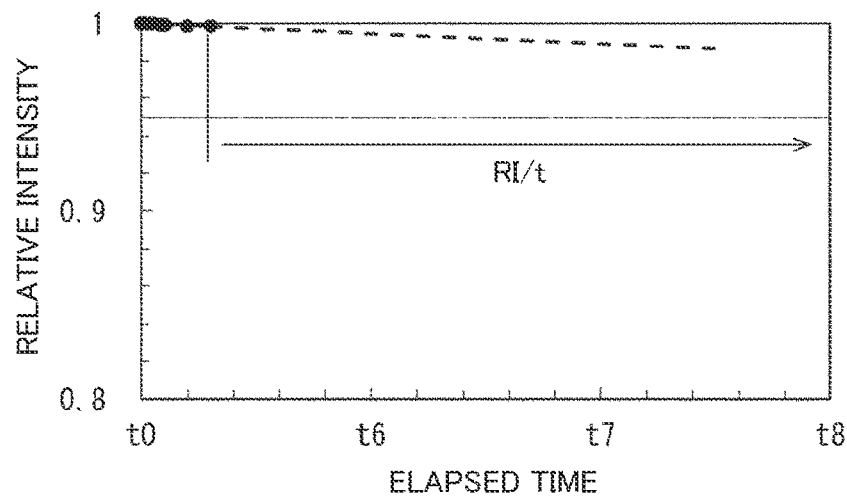
FIG. 4 is a representation of the results of a test conducted on the light-emitting element shown in FIG. 1 under actual use conditions.

FIG. 4 is a representation of the results of a test conducted on the light-emitting element 1 under actual use conditions. FIG. 4 gives prescribed times t6 to t8 on the horizontal axis that are longer than prescribed times t1 to t5 in FIGS. 2 and 3. Prescribed times t6 to t8, although denoting a shorter period of time in the order of t6, t7, and t8, have specific numerical values respectively that may vary with the properties of the light-emitting element 1.

FIG. 4 shows that the relative intensity of the light-emitting element 1 decreased slightly with time from the start of the test even to a time equivalent to prescribed time t3, but stayed far above 0.95. FIG. 4 further shows that the relative intensity was as high as approximately 0.98 even at t8, which is approximately 10 times prescribed time t3. Compared to the previous accelerated test, the decay factor under actual use conditions was approximately ¹/₁₀ the decay factor in the high-temperature, high-humidity, high-luminance environment.

FIG. 4 additionally shows that the relative intensity RI decreased with time t at substantially the same rate (RI/t) after a time equivalent to time t3 as up to the time equivalent to time t3.

COMPARATIVE EXAMPLE

Figure 7:
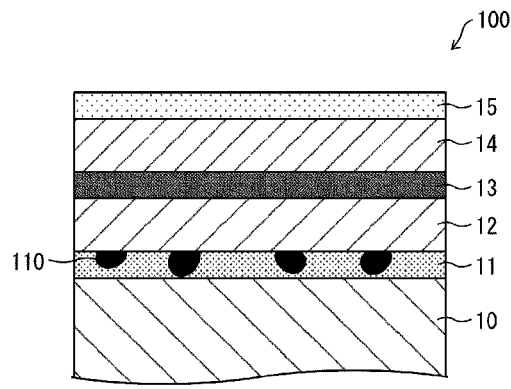
FIG. 7 is a schematic illustration of issues with a known light-emitting element.

For comparative purposes, a light-emitting element was prepared that contained no sulfur-atom-fixing material in the QD layer and simultaneously subjected to the aforementioned reliability test. In this light-emitting element, black spots 110 (see FIG. 7) formed in parts of the reflective, first electrode approximately in half of prescribed time t3. Voltage rose, and luminance fell at the same time. FIG. 7 is a schematic illustration of issues with a known light-emitting element.

Figure 5:
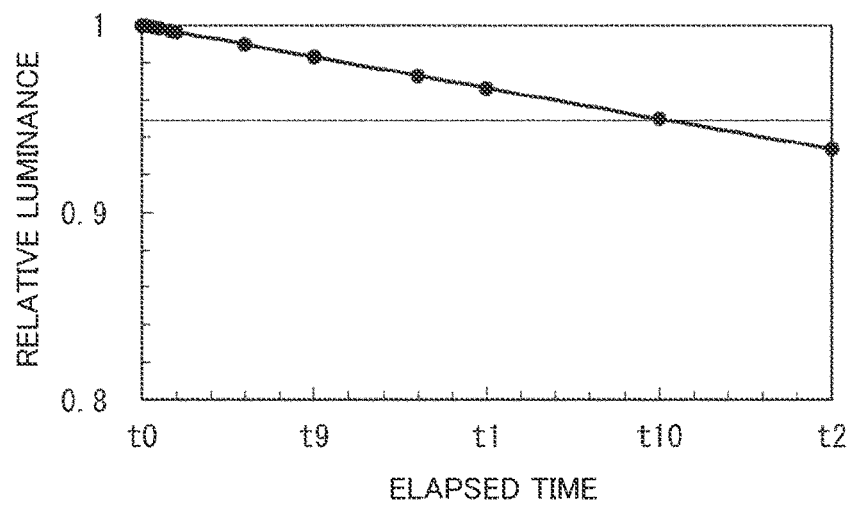
FIG. 5 is a representation of the results of a (first) accelerated test conducted on a known light-emitting element in a high-temperature, high-humidity, high-luminance environment.

FIG. 5 is a representation of the results of an accelerated test conducted on a light-emitting element containing no sulfur-atom-fixing material in the QD layer thereof in a high-temperature, high-humidity, high-luminance environment (first accelerated test, luminance changes). FIG. 5 corresponds to FIG. 2. FIG. 5 gives prescribed times t9 and t10 on the horizontal axis that are approximately ⅙ and ½ of prescribed time t3 in FIGS. 2 and 3 respectively.

FIG. 5 shows that the relative luminance of the light-emitting element in accordance with the comparative example reached 0.95 in prescribed time t10 after the start of the test and then stayed below 0.95 after t10.

Figure 6:
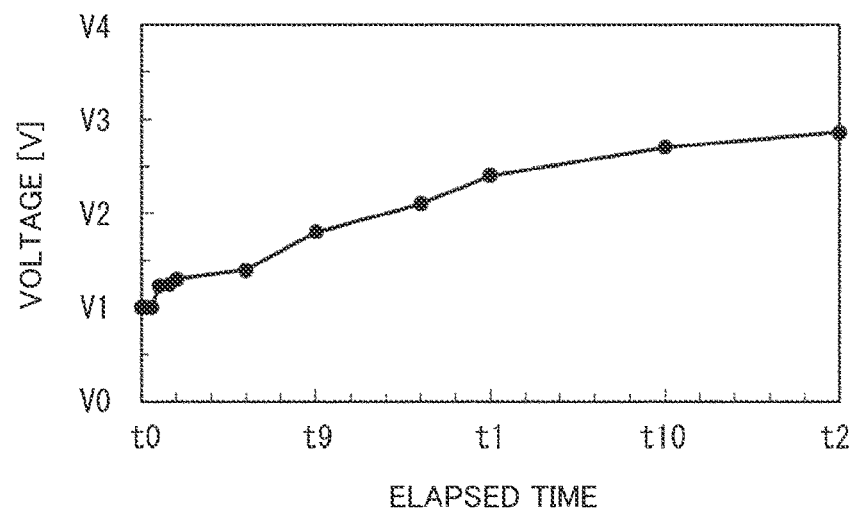
FIG. 6 is a representation of the results of another (second) accelerated test conducted on a known light-emitting element in a high-temperature, high-humidity, high-luminance environment.

FIG. 6 is a representation of the results of another accelerated test conducted on a light-emitting element containing no sulfur-atom-fixing material in the QD layer thereof in a high-temperature, high-humidity, high-luminance environment (second accelerated test, voltage changes). FIG. 6 corresponds to FIG. 3. FIG. 6 shows that the voltage across the light-emitting element in accordance with the comparative example increased to V3, which is higher than V2, in t2, which is shorter than prescribed time t3, after the start of the test.

Analysis of Causes of Falling Reliability in Comparative Example

Applicant removed the known light-emitting element whose reliability fell, for analysis by cross-sectional TEM (transmission electron microscope). The analysis verified that a structure different from the surroundings had grown in a region of the first electrode.

Figure 9:
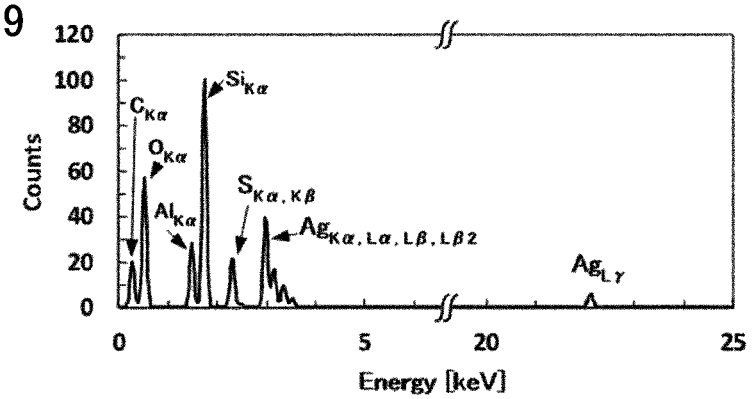
FIG. 9 is a diagram representing an EDX spectrum of a first electrode shown in FIG. 7.
Figure 10:
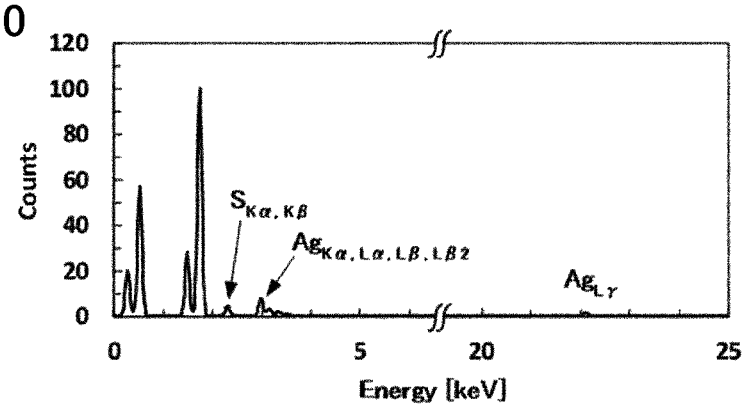
FIG. 10 is a diagram representing an EDX spectrum of a second electrode shown in FIG. 7.

Sulfur was detected in this region in addition to silver, which is the inherent component of the first electrode. The concentration ratio of the silver and sulfur was approximately 2:1, indicating that silver sulfide had formed. A trace of sulfur was found also in the second electrode. However, since the transmissive, second electrode was as thin as 10 nm or even less, the second electrode did not produce so clear an EDX (energy dispersive X-ray microanalyzer) signal as the first electrode (see FIGS. 9 and 10). FIG. 9 is a diagram representing an EDX spectrum of the first electrode shown in FIG. 7. FIG. 10 is a diagram representing an EDX spectrum of the second electrode.

A SIMS analysis (secondary ion mass spectrometry) was performed next on the surface of the light-emitting element to check the thickness-wise distribution of sulfur atoms in the light-emitting element. A sulfur depth profile was prepared by SIMS while etching out a tiny area by sputtering. A concentration profile was obtained where the sulfur atom concentration, although being semi-constant because of the nature of SIMS, peaked in the light-emitting layer and changed exponentially with the distance from the light-emitting layer toward the first/second electrode. These sulfur atom concentration changes presumably occurred because the sulfur atoms in the light-emitting layer diffused with time in the reliability test (see FIGS. 8 and 12).

Figure 8:
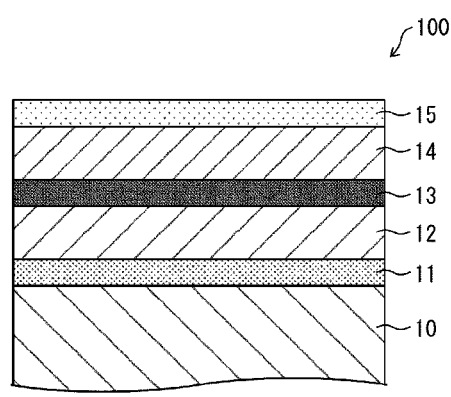
FIG. 8 is a schematic illustration of likely causes of the issues shown in FIG. 7.

In other words, FIG. 8 shows that when the light-emitting layer 13 contained the sulfur-atom-fixing material 2, the sulfur atoms in the light-emitting layer 13 diffused to the carrier transport layer and the electrode, producing a sulfur atom concentration that increased with the increasing distance from the light-emitting layer 13.

Figure 12:
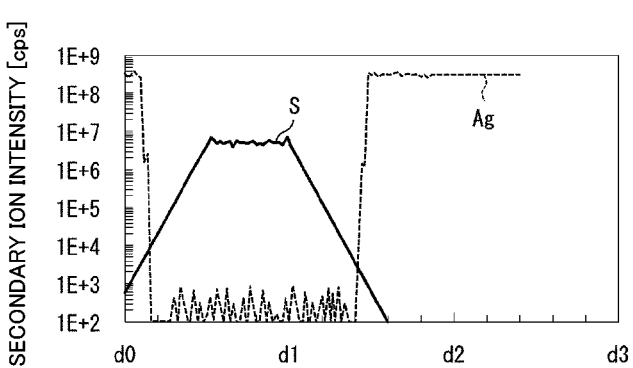
FIG. 12 is a diagram representing a SIMS profile of a known light-emitting element.

FIG. 8 is a schematic illustration of likely causes of the issues shown in FIG. 7. FIG. 12 is a diagram representing a SIMS profile of a known light-emitting element.

The sulfur atoms in the light-emitting layer presumably originate in the ZnS that is a QD shell material. ZnS is a Group II-VI compound semiconductor. The Group VI element in a Group II-VI compound will generally readily dissociate. The sulfur atoms in the Group VI element therefore presumably dissociated when the light-emitting element was driven by electric current.

The light-emitting layer of a QLED is not a uniform layer, but a stack of nanometer scale quantum dots. A relatively high electric field is therefore applied across the QD layer in transporting electric charges to quantum dots. It is also known that excess electric charge can collect near the QD surface, which is likely to trigger an Auger process.

Dissociation of sulfur atoms is prompted presumably under electric current in those quantum dots having collided with electrons accelerated in a strong electric field or having been exposed to Auger electrons that have a high level of energy equivalent to twice the band gap. The sulfur atoms hence produced in the light-emitting layer are driven by the concentration difference between the light-emitting layer and the other members to diffuse out of the light-emitting layer, reaching the first/second electrode where the sulfur atoms form silver sulfide (see FIG. 13).

Subsequently, the light-emitting element 1 in accordance with the present example was similarly analyzed. No blackening was found in the first electrode 11 and the second electrode 15. It was verified that in the layered structure, appreciable levels of sulfur atom concentration were only found in the light-emitting layer. The analysis demonstrates that the sulfur-atom-fixing material 2, residing in the light-emitting layer 13 along with quantum dots in the structure of the present example, captures the dissociate sulfur atoms, thereby preventing the sulfur atoms from diffusing to the outside (see FIGS. 11 and 13).

Figure 11:
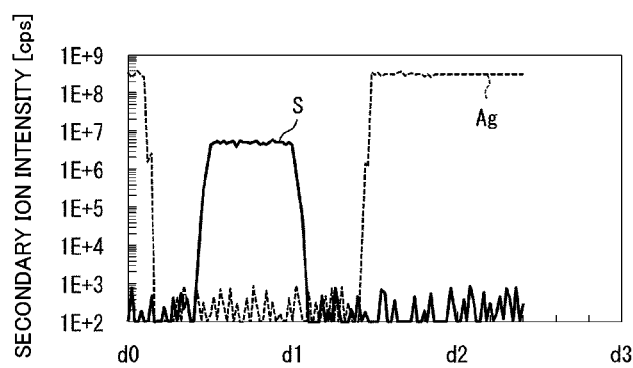
FIG. 11 is a diagram representing a SIMS profile of a light-emitting element to which a sulfur-atom-fixing material has been added.
Figure 13:
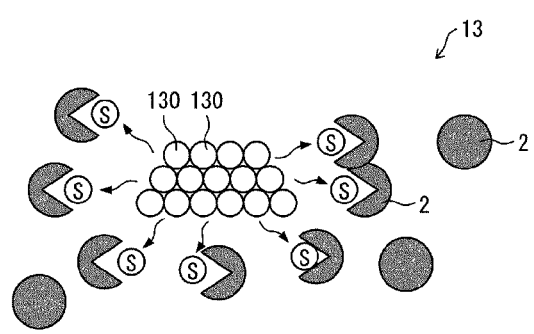
FIG. 13 is a schematic illustration of the sulfur-atom-fixing material fixing sulfur atoms that could otherwise diffuse to the outside due to a concentration difference.

FIG. 11 is a diagram representing a SIMS profile of a light-emitting element to which a sulfur-atom-fixing material has been added. FIG. 13 is a schematic illustration of the sulfur-atom-fixing material 2 fixing sulfur atoms that could otherwise diffuse to the outside due to a concentration difference. FIG. 13 is also a schematic imaginary rendition of structural members. Referring to FIG. 13, the reference numeral "13" denotes a light-emitting layer, and the reference numeral "130" denotes those quantum dots in the light-emitting layer 13 from which sulfur atoms have dissociated.

Detailed Description of Sulfur-Atom-Fixing Material

The sulfur-atom-fixing material 2, in the present example, preferably includes a long-chain alkyl group and any of a phenyl group, an NH group, and an SH group. The sulfur-atom-fixing material 2 preferably further includes at least two of 2-heptadecylimidazole, 2-mercaptobenzothiazole, and thionalide.

Specifically, sulfur is a Group VI element like oxygen and has the highest chemical activity after oxygen. The sulfur atom has a strong propensity to accept two electrons to form a closed shell structure similarly to the oxygen atom and readily exchanges electrons especially with carbon-containing compounds. The sulfur atom likewise readily accepts electrons from basic compounds.

From these properties, the sulfur atom has a propensity to exchange electrons with, and bind to:
(1) compounds with a benzene ring, which readily accepts electrons, and
(2) basic compounds.

Therefore, these are desirable properties of the sulfur-atom-fixing material.

Meanwhile, compounds (1), if having an excessively strong affinity to sulfur atoms, the compounds may not only fix sulfur atoms alone, but also react with those compounds which contain the sulfur atoms. With a view to controlling the reactivity of these compounds such that the compounds react stably with sulfur atoms alone, the following compounds are preferred in which the hydrogen bonds in the structure are weakened:
(3) compounds with a phenyl group derived from a benzene ring,
(4) compounds with an NH group derived from a benzene ring, and
(5) compounds with an SH group derived from a benzene ring.

The compounds in (3) to (5) may additionally include an alkyl group. However, since alkyl groups are such that the reduced carbon atoms in the structure readily exchange electrons with oxygen atoms and sulfur atoms, it is more preferable that the reactivity be restrained by increasing carbon atoms in number to construct larger branches and decrease the surface area of the molecule. In other words, the compounds in (3) to (5) may be
(6) compounds with a long-chain alkyl group.

This is another desirable property of the sulfur-atom-fixing material.

In the components in (1) and (2), in addition to the basic properties given above, quantum dots need to be dispersed in a medium in the QLED manufacturing process. Furthermore, water, which is a polar medium, is not desirable in view of the reliability of the quantum dots and the ligands coordinated to the quantum dots in relation to oxidation. It is therefore preferable to use quantum dots dispersed in a non-polar medium. Accordingly,
(7) the sulfur-atom-fixing material must be soluble in the non-polar medium.

Preferred examples of the sulfur-atom-fixing material that meet these requirements (1) to (7) include those compounds which include at least two of 2-heptadecylimidazole, 2-mercaptobenzothiazole, and thionalide.

The light-emitting layer includes quantum dots with a core and a shell covering the core as described earlier in Example 1. Either one or both of the core and the shell may contain sulfur atoms in the present example.

The shell may contain sulfur atoms with a sulfur atom concentration of greater than or equal to $8.5 \times 10^{21}$ cm$^{-3}$ on the outer edge of the shell.

The sulfur atoms inside the shell are not dissociated (not shown) if the boundary between the core and the shell is made the point of origin immediately after the manufacture of the light-emitting element. The sulfur atoms dissociate with time, but only gently change the concentration thereof since the dissociated sulfur atoms are fixed by the sulfur-atom-fixing material in the present example.

On the other hand, it was verified that the sulfur atoms abruptly increased the concentration thereof in related art where there is provided no sulfur-atom-fixing material.

Accordingly, the sulfur concentration in the shell presumably changes over time in such a manner that the sulfur concentration monotonically decreases toward the outer circumference along the radius of the quantum dot.

Referring to FIG. 1, the sulfur-atom-fixing material 2, which fixes sulfur atoms by chemically binding to the sulfur atoms, is used in the present example. The sulfur-atom-fixing material 2 hence fixes, between the first electrode 11 and the second electrode 15, the sulfur atoms contained as a component of the light-emitting material in the light-emitting layer 13 and the sulfur atoms that may contaminate the light-emitting layer 13 and/or the vicinity thereof in the manufacture of the light-emitting element 1.

This mechanism can restrain the sulfur atoms from reaching the first electrode 11 and/or the second electrode 15. That can restrain sulfurization of the metal material for the first electrode 11 and the metal material for the second electrode 15, which can in turn restrain degradation of the electrical and optical properties of the light-emitting element 1.

Process of Manufacturing Light-Emitting Element

The following will describe a process of manufacturing the light-emitting element 1 in accordance with the present example with reference to FIG. 1. The light-emitting element 1 may be manufactured by a known method.

First of all, the reflective, first electrode 11 is formed on the array substrate 10 by vapor deposition if, as an example, the light-emitting element 1 is so structured that the light emitted by the light-emitting layer 13 can be extracted in the direction of from the first electrode 11 to the second electrode 15 ("top emission" structure). Silver is used either alone or in the form of an alloy with magnesium or aluminum to increase reflectance.

Next, the first carrier transport layer 12 is formed by sputtering, liquid coating and baking, or colloidal nanoparticle liquid coating. The first carrier transport layer 12 may be formed by a technique selected to suit the material.

Next, the light-emitting layer 13 is formed. The description here is based on the assumption that the light-emitting element 1 is a QLED. The light-emitting layer 13 is formed by, for example, coating with a QD-containing colloidal solution, photolithography patterning using a QD-dispersed photoresist, or printing using QD-dispersed ink. Any of these techniques may be selectively employed so as to suit, for example, the structure and panel size of the light-emitting element.

The present example includes, as well as quantum dots, a compound that has a function of fixing sulfur atoms regardless of the technique employed to form the layered structure. The sulfur-atom-fixing material will be described later in detail.

The second carrier transport layer 14 is formed after the light-emitting layer (QD layer) 13. The second carrier transport layer 14 may be formed by the same technique as the first carrier transport layer 12. However, since the second carrier transport layer 14 is disposed on the light-emitting layer (QD layer) 13, the second carrier transport layer 14 is preferably formed by liquid coating or vapor deposition, rather than by sputtering in which impacts under heavy ions are likely. It is preferable to quickly finish the formation to prevent degradation of quantum dots at elevated temperatures if vapor deposition is employed.

Lastly, the transmissive, second electrode 15 is formed by sputtering or vapor deposition. After wiring is made, sealing is provided entirely, which concludes the manufacturing process. Since the second electrode 15 is formed on the second carrier transport layer 14, sputtering does not deliver impacts under ions to the QD layer. This manufacturing step completes the manufacture of the structure of the light-emitting element 1 in accordance with the present example.

The light-emitting element 1 does not necessarily have a top emission structure and may have a "bottom emission" structure in which the light emitted by the light-emitting layer 13 is extracted in the direction of from the second electrode 15 to the first electrode 11. When the light-emitting element 1 has a bottom emission structure, the first electrode 11 is a light-transmitting, transparent electrode, and the second electrode 15 is a light-reflecting, reflective electrode.

Example 2

A light-emitting element in accordance with the present example of the disclosure (not shown) has the same structure as the light-emitting element 1 in accordance with Example 1, except that the light-emitting layer in the former contains a sulfur-atom-fixing material. Namely, the sulfur-atom-fixing material 2 is provided only in the light-emitting layer 13 in the present example (see FIG. 1).

When the sulfur-atom-fixing material 2 is provided only in the light-emitting layer 13, the sulfur atom concentration is kept substantially uniform in the light-emitting layer 13, which can restrain diffusion to the carrier transport layer and the electrode.

The sulfur-atom-fixing material 2 can fix sulfur atoms in the light-emitting layer 13. This mechanism can restrain sulfur atoms from reaching the first electrode 11 and/or the second electrode 15.

Example 3

A description is given next of another example of the light-emitting element including a sulfur-atom-fixing material. A light-emitting element in accordance with the present example of the disclosure (not shown) may, in comparison with the light-emitting element 1 in accordance with Example 1, include the first carrier transport layer 12 and the second carrier transport layer 14 similarly to the light-emitting element 1, either one or both of the first carrier transport layer 12 and the second carrier transport layer 14 containing the sulfur-atom-fixing material 2 (see FIG. 1).

The sulfur-atom-fixing material can thus fix sulfur atoms in the first carrier transport layer and/or the second carrier transport layer, thereby restraining the sulfur atoms from reaching the first electrode and/or the second electrode.

Example 4

A description is given next of another example of the light-emitting element including a sulfur-atom-fixing material. A light-emitting element in accordance with the present example of the disclosure (not shown) differs from the light-emitting element 1 in accordance with Example 1 in that the former includes an intermediate layer (not shown) containing the sulfur-atom-fixing material 2.

Specifically, the light-emitting element in accordance with the present example includes a first carrier transport layer between the light-emitting layer and the first electrode. The intermediate layer is disposed between the light-emitting layer and the first carrier transport layer (see FIG. 1).

The sulfur-atom-fixing material in the intermediate layer can thus fix sulfur atoms in the intermediate layer, thereby restraining the sulfur atoms from reaching the first electrode.

Example 5

A description is given next of another example of the light-emitting element including a sulfur-atom-fixing material. A light-emitting element in accordance with the present example of the disclosure (not shown) differs from the light-emitting element 1 in accordance with Example 1 in that the former includes an intermediate layer (not shown) containing the sulfur-atom-fixing material 2.

Specifically, the light-emitting element in accordance with the present example includes a first carrier transport layer between the light-emitting layer and the first electrode. The intermediate layer is disposed between the first carrier transport layer and the first electrode (see FIG. 1).

The sulfur-atom-fixing material can thus fix sulfur atoms in the intermediate layer, thereby restraining the sulfur atoms from reaching the first electrode.

Thickness of Intermediate Layer in Detail

A description is given next of the thickness of the intermediate layer in Example 4 and Example 5. The thickness of the intermediate layer is preferably greater than or equal to 1 nm and less than or equal to 5 nm, with a view to restraining the intermediate layer from inhibiting carrier transport in the light-emitting element and also to enabling the intermediate layer to function as a film.

This structure can restrain the intermediate layer from inhibiting carrier transport in the light-emitting element, by specifying the thickness of the intermediate layer to less than or equal to 5 nm. Meanwhile, the thickness of the intermediate layer is preferably greater than or equal to 1 nm to enable the intermediate layer to function as a film.

Example 6

The intermediate layer has been so far described primarily as a single layer. The intermediate layer is however not necessarily a single layer. A description is given next of a structure of the present example of the disclosure. A light-emitting element in accordance with the present example of the disclosure (not shown) differs from the light-emitting elements in accordance with the foregoing examples in that the former includes two intermediate layers (not shown) containing the sulfur-atom-fixing material 2.

Specifically, the light-emitting element in accordance with the present example includes: a first intermediate layer containing a sulfur-atom-fixing material; a second intermediate layer containing a sulfur-atom-fixing material; a first carrier transport layer between the light-emitting layer and the first electrode; and a second carrier transport layer between the light-emitting layer and the second electrode.

The first intermediate layer may be disposed between the light-emitting layer and the first carrier transport layer, and the second intermediate layer may be disposed between the light-emitting layer and the second carrier transport layer (see FIG. 1).

The sulfur-atom-fixing material in the two intermediate layers can thus fix sulfur atoms in the first intermediate layer and/or the second intermediate layer, thereby restraining the sulfur atoms from reaching the first electrode and/or the second electrode.

Example 7

A description is given next of another example of the light-emitting element including two intermediate layers. A light-emitting element in accordance with the present example of the disclosure (not shown) differs from the light-emitting element in accordance with Example 6 above in the location of the intermediate layers.

Specifically, the light-emitting element in accordance with the present example includes: a first intermediate layer containing a sulfur-atom-fixing material; a second intermediate layer containing a sulfur-atom-fixing material; a first carrier transport layer between the light-emitting layer and the first electrode; and a second carrier transport layer between the light-emitting layer and the second electrode.

The first intermediate layer may be disposed between the first carrier transport layer and the first electrode, and the second intermediate layer may be disposed between the second carrier transport layer and the second electrode.

The sulfur-atom-fixing material can thus fix sulfur atoms in the first intermediate layer and/or the second intermediate layer, thereby restraining the sulfur atoms from reaching the first electrode and/or the second electrode.

Example 8

A description is given next of another example of the light-emitting element including two intermediate layers. A light-emitting element in accordance with the present example of the disclosure (not shown) differs from the light-emitting elements in accordance with Examples 6 and 7 above in the location of the intermediate layers.

Specifically, the light-emitting element in accordance with the present example includes: a first intermediate layer containing a sulfur-atom-fixing material; a second intermediate layer containing a sulfur-atom-fixing material, a first carrier transport layer between the light-emitting layer and the first electrode; a second carrier transport layer between the light-emitting layer and the second electrode. The first intermediate layer may be disposed between the light-emitting layer and the first carrier transport layer, and the second intermediate layer may be disposed between the second carrier transport layer and the second electrode.

The sulfur-atom-fixing material can thus fix sulfur atoms in the first intermediate layer and/or the second intermediate layer, thereby restraining the sulfur atoms from reaching the first electrode and/or the second electrode.

As a variation example of the present example, the first intermediate layer may be disposed between the light-emitting layer and the second carrier transport layer, and the second intermediate layer may be disposed between the first carrier transport layer and the first electrode. In other words, one of the intermediate layers may be disposed between the light-emitting layer and the carrier transport layer, and the other one of the intermediate layers may be disposed between the carrier transport layer and the electrode. The sulfur-atom-fixing material needs only to be contained at least somewhere between the light-emitting layer and the silver-containing electrode.

Thicknesses of First and Second Intermediate Layers in Detail A description is given next of the thickness of the first intermediate layer and the second intermediate layer in accordance with Examples 6 to 8. The thickness(es) of either one or both of the first intermediate layer and the second intermediate layer is/are preferably greater than or equal to 1 nm and less than or equal to 5 nm, with a view to restraining the first intermediate layer and the second intermediate layer from inhibiting carrier transport in the light-emitting element and also to enabling the first intermediate layer and the second intermediate layer to function as films.

This structure can restrain the first and second intermediate layers from inhibiting carrier transport in the light-emitting element, by specifying the thicknesses of the first and second intermediate layers to less than or equal to 5 nm. Meanwhile, the thicknesses of the first and second intermediate layers are preferably greater than or equal to 1 nm to enable the first and second intermediate layers to function as films.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A light-emitting element comprising:
a first electrode;
a second electrode;
a light-emitting layer between the first electrode and the second electrode; and
a sulfur-atom-fixing material between the first electrode and the second electrode, the sulfur-atom-fixing material being configured to fix sulfur atoms by chemically binding to the sulfur atoms, wherein
the light-emitting layer contains the sulfur-atom-fixing material, and
the sulfur-atom-fixing material accounts for greater than or equal to 0.02% and less than or equal to 1% of the light-emitting layer in weight.

2. A light-emitting element comprising:
a first electrode;
a second electrode;
a light-emitting layer between the first electrode and the second electrode;
a sulfur-atom-fixing material between the first electrode and the second electrode, the sulfur-atom-fixing material being configured to fix sulfur atoms by chemically binding to the sulfur atoms;
a first intermediate layer and a second intermediate layer, each containing the sulfur-atom-fixing material;
a first carrier transport layer between the light-emitting layer and the first electrode; and
a second carrier transport layer between the light-emitting layer and the second electrode, wherein
the first intermediate layer is between the light-emitting layer and the first carrier transport layer, and
the second intermediate layer is between the light-emitting layer and the second carrier transport layer.

3. The light-emitting element according to claim 2, wherein at least one of the first intermediate layer and the second intermediate layer has a thickness of greater than or equal to 1 nm and less than or equal to 5 nm.

4. The light-emitting element according to claim 1, wherein the sulfur-atom-fixing material comprises a long-chain alkyl group, and any one of a phenyl group, an NH group, or an SH group.

5. The light-emitting element according to claim 4, wherein the sulfur-atom-fixing material further comprises at least two of 2-heptadecylimidazole, 2-mercaptobenzothiazole, or thionalide.

6. The light-emitting element according to claim 1, wherein at least one of the first electrode and the second electrode contains silver.

7. The light-emitting element according to claim 1, wherein
the light-emitting layer comprises quantum dots,
the quantum dots include a core and a shell covering the core, and at least one of the core and the shell contains the sulfur atoms.

8. A light-emitting element comprising:
a first electrode;
a second electrode;
a light-emitting layer between the first electrode and the second electrode; and
a sulfur-atom-fixing material between the first electrode and the second electrode, the sulfur-atom-fixing material being configured to fix sulfur atoms by chemically binding to the sulfur atoms, wherein
the light-emitting layer comprises quantum dots,
the quantum dots include a core and a shell covering the core,
the shell contains the sulfur atoms, and
the sulfur atoms have a concentration of greater than or equal to $8.5 \times 10^{21}$ $cm^{-3}$ on an outer edge of the shell.

* * * * *